United States Patent
Zannoth et al.

(10) Patent No.: US 7,928,774 B2
(45) Date of Patent: Apr. 19, 2011

(54) ADAPTIVE DRIVE SIGNAL ADJUSTMENT FOR BRIDGE EMI CONTROL

(75) Inventors: Markus Zannoth, Neubiberg (DE); Karl-Josef Martin, Munich (DE); Karl-Dieter Hein, Schwindegg (DE)

(73) Assignee: Infineon Technologies AG, Neubiberg (DE)

( * ) Notice: Subject to any disclaimer, the term of this patent is extended or adjusted under 35 U.S.C. 154(b) by 136 days.

(21) Appl. No.: 12/240,544

(22) Filed: Sep. 29, 2008

(65) Prior Publication Data

US 2010/0079186 A1 Apr. 1, 2010

(51) Int. Cl.
*H03K 3/00* (2006.01)
(52) U.S. Cl. .......................................... 327/108; 326/82
(58) Field of Classification Search ........... 327/108–112
See application file for complete search history.

(56) References Cited

U.S. PATENT DOCUMENTS

| | | | |
|---|---|---|---|
| 4,841,166 A * | 6/1989 | Harnden | 327/110 |
| 5,422,597 A | 6/1995 | Stengel et al. | |
| 5,598,119 A | 1/1997 | Thayer et al. | |
| 6,441,653 B1 | 8/2002 | Spurlin | |
| 6,580,625 B2 * | 6/2003 | Throngnumchai et al. | 363/97 |
| 6,903,597 B2 * | 6/2005 | Tai | 327/434 |
| 7,091,752 B2 * | 8/2006 | Balakrishnan | 327/108 |
| 7,091,753 B2 * | 8/2006 | Inoshita | 327/108 |
| 7,570,085 B2 * | 8/2009 | Ishikawa et al. | 327/108 |
| 2007/0013411 A1 | 1/2007 | Asaduzzaman et al. | |
| 2009/0140780 A1 * | 6/2009 | Miyazaki et al. | 327/112 |
| 2010/0060326 A1 * | 3/2010 | Palmer et al. | 327/109 |
| 2010/0231269 A1 * | 9/2010 | Nakatake et al. | 327/109 |

OTHER PUBLICATIONS

Huang, X,, et al., "EMI Characterization with Parasitic Modeling for a Permanent Magnet Motor Drive," IEEE, 2003, pp. 416-423.
Težak, O., et al., "Snubber Design Approach for DC-DC Converter Based on Differential Evolution Method," IEEE, AMC, 2004, Kawasaki, Japan, pp. 87-91.

* cited by examiner

*Primary Examiner* — Lincoln Donovan
*Assistant Examiner* — William Hernandez
(74) *Attorney, Agent, or Firm* — Slater & Matsil, L.L.P.

(57) ABSTRACT

An embodiment of the invention relates to a driver adapted to provide a drive signal with an adjustable waveform for an external bridge to control EMI. The driver includes a detector configured to measure a switching characteristic of a switch in the external bridge to produce the drive signal with an adjustable waveform characteristic. The driver includes an adjustable circuit element to adjust the waveform characteristic in response to the measured switching characteristic. The measured switching characteristic may be a derivative of a voltage of the switch in the bridge such as a derivative of a drain-to-source voltage of a half-bridge circuit. The driver may be formed with an amplifier with an adjustable gain controlled by the signal produced by the detector. The adjustable gain amplifier may be formed with a transistor coupled in series with a leg of a current mirror.

21 Claims, 13 Drawing Sheets

ADAPTIVE DRIVE SIGNAL ADJUSTMENT FOR BRIDGE EMI CONTROL

TECHNICAL FIELD

An embodiment of the invention relates generally to driver circuits and methods, and more particularly to adjustment of a drive signal to control EMI (electromagnetic interference) produced by switching a transistor.

BACKGROUND

The utilization of high-frequency switching circuits in power conversion applications to produce high efficiency circuits has introduced the new issue of managing electromagnetic interference produced by high-frequency waveforms. These waveforms are coupled through parasitic circuit elements, such as stray capacitances and incidental magnetic flux linkages, to other portions of a circuit, and result in electromagnetic radiation and in signal components conducted to power source and load circuits. The allowable level of EMI produced in an end product is generally regulated in the U.S. by 47 C.F.R. §15 (also referred to as "FCC Part 15"), and by other national standards in other countries.

In automotive applications, three-phase brushless motors are often employed to operate a mechanical device when a high actuator power density is required. Three-phase brushless motors can provide accurate speed control, for example, for applications such as electric power steering. The motor speed control arrangement generally employs pulse-width modulation to control the input power to the motor, with a pulse repetition frequency that is typically about 20 kHz. A drawback of conventional pulse-generation arrangements wherein drive signals are produced for the pulse-width modulated pulses that control the input power to the motor is that high current pulses coupled to the motor combined with a high pulse switching speed generally produce a high level of conducted (and radiated) EMI.

A half-bridge driver employing conventional design practices produces an output pulse-width modulated waveform with a waveform characteristic such as a rise time or a fall time that is substantially independent of an operating condition of the driven bridge. As a result, a conventional design of a half-bridge driver unnecessarily produces an unnecessarily high level of EMI, for example, at a light load on a motor. A conventional half-bridge driver arrangement may adaptively alter a pulse width in response to a sensed motor load, but an altered pulse width may be insufficient to reduce EMI to an acceptable level without an added EMI filter, such as an inductor-capacitor low-pass filter that adds unnecessary volume and cost to a product design.

Thus, there is a need for a process and related method to reduce a level of EMI produced by a power switching arrangement coupled to a driver that avoids disadvantages of conventional approaches.

SUMMARY OF THE INVENTION

In accordance with an exemplary embodiment, a driver adapted to provide a drive signal with an adjustable waveform for an external bridge to control EMI thereof and a related method are provided. In an embodiment, the driver includes a detector configured to measure a switching characteristic of an external bridge, such as a switching characteristic of a switch in the external bridge, and is configured to produce the drive signal with an adjustable waveform characteristic. The driver includes an adjustable circuit element coupled to the detector. A signal produced by the detector in response to the measured switching characteristic is employed to adjust the waveform characteristic. In an embodiment, the measured switching characteristic is a derivative of a voltage of the switch in the bridge. In a further embodiment, the derivative of the voltage is a derivative of a drain-to-source voltage of the external switch. In an embodiment, the switch of the external bridge is a power switch of a half-bridge circuit. In a further embodiment, the driver includes a first and a second plurality of drive transistors. The drive transistors of the second plurality are respectively coupled in parallel with the drive transistors of the first plurality, and the transistors of the second plurality are disabled by assertion of the signal produced by the detector. Preferably, the drive transistors of the second plurality are substantially larger then the drive transistors of the first plurality. In an embodiment, the adjustable circuit element includes an amplifier with an adjustable gain that is controlled by the signal produced by the detector. In an embodiment, the amplifier with the adjustable gain includes a transistor coupled in series with a leg of a current mirror, and the signal produced by the detector is coupled to the transistor coupled in series with the leg of the current mirror to control the waveform characteristic of the drive signal. In an embodiment, the driver further includes a transconductance amplifier with an output coupled to an input of the amplifier with the adjustable gain. In an embodiment, the driver further includes a high-pass filter with an output coupled to an input of the amplifier with the adjustable gain.

BRIEF DESCRIPTION OF THE DRAWINGS

The details of one or more embodiments of the invention are set forth in the accompanying drawings and the description below. Other features, objects, and advantages of the invention will be apparent from the description and drawings, and from the claims. In the figures, identical reference symbols generally designate the same component parts throughout the various views, and may be described only once in the interest of brevity. For a more complete understanding of the invention, reference is now made to the following descriptions taken in conjunction with the accompanying drawings, in which:

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to exemplary embodiments in a specific context, namely adjusting the amplitude of a drive signal for a power switch in a half-bridge circuit.

An embodiment of the invention may be applied to various power conversion and switching arrangements that include other switching topologies, for example, to a full-bridge, three-phase bridge, or a flyback circuit. Other power conversion and switching arrangements can be constructed and applied using processes as introduced herein in different contexts using inventive concepts described herein, for example, a power switching arrangement used to control the speed of a motor.

Motors in typical actuator applications such as in automobiles are often not operated under full load, which opens the possibility to operate them with slower pulse-switching waveforms to produce less conducted radiation. As introduced herein, the switching speed of the pulse train applied to the motor is adapted to a measured switching characteristic of the half-bridge coupled to the motor to reduce EMI.

A half-bridge circuit is often used to produce a high power pulse train to control a mechanical actuator such as a motor. Bridge drivers are used to turn external transistors in the bridge circuit on and off. This two-device solution is used when a monolithic solution cannot be used because the current and switching speed are high at the switched bridge transistors. Examples include power steering, starters, and alternators and automotive applications where high-current motors are controlled by a 20 kHz pulse-width modulated signal.

Because high currents are switched in very short time intervals, very high current peaks are produced that result in voltage peaks at the terminals of the bridge transistors. Any physical wiring such as transistor wiring is inherently inductive, which enables a simulation employing parasitic inductors to represent wiring to produce the resulting voltage spikes that generate the high EMI spectral emissions on the supply lines. With high current pulses and fast switching times, the spectral emissions cannot be easily reduced. As introduced herein, reduction of the emitted spectrum is advantageously accomplished by adaptively shaping the waveform of the drive signals for the bridge transistors in response to a measured switching characteristic thereof without substantially compromising switching speed of the bridge transistors.

To reduce the emitted spectrum produced by a high-frequency bridge, such as a high-frequency half-bridge circuit coupled to a motor, the rise and fall times of the pulsed signal waveform therefrom are adaptively adjusted in response to measured switching characteristics of the bridge. It is recognized that the pulse width and pulse period are controlled by the pulse-width modulation arrangement that controls the rotation rate of the motor, and pulse width cannot be altered without affecting the result of the control process.

In several conventional applications, signal predistortion has been employed to reduce radiation, such as using up to three signal levels to drive a bridge. But these switching arrangements do not adapt a signal level to changes in the load presented to the bridge or to other external effects. In essence, the signal predistortion arrangement operates with a predetermined program in the chip set that drives the bridge.

As introduced herein an adaptive process is continuously operable to provide an optimal pulse switching condition to reduce EMI for an application. A bridge switching characteristic is continuously sensed, and a bridge driving parameter is adjusted in response thereto to control EMI. Thus, reduction of radiation is automatic, and is adaptively and immediately adjusted to changes in the environment without preset programming. No external components are needed, excepting a pin to sense a bridge characteristic such as a voltage slope.

Figure 1:
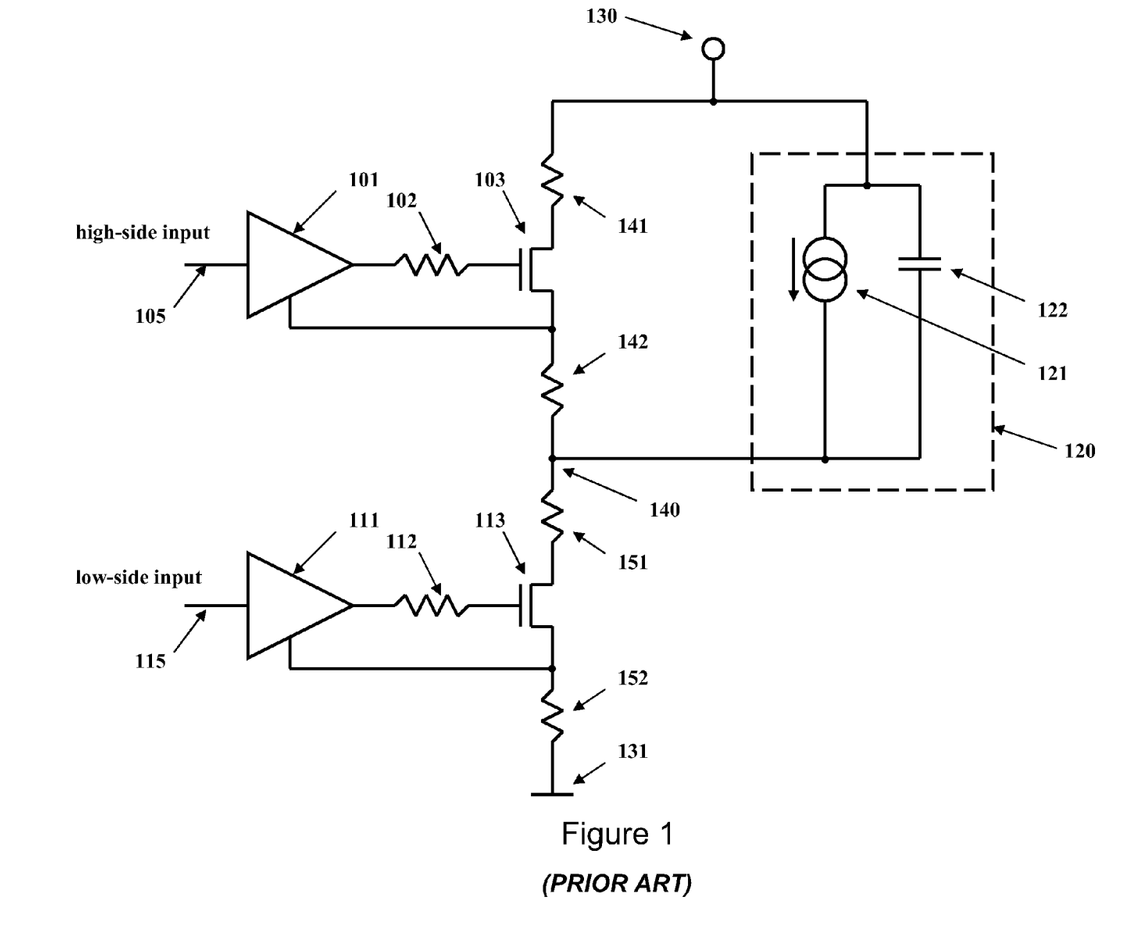
FIG. 1 illustrates a schematic drawing showing an example of a conventional half-bridge circuit coupled to a motor.

Turning now to FIG. 1, illustrated is a schematic drawing showing an example of a conventional half-bridge circuit coupled to a motor 120. The motor 120 is represented by an ideal current source 121 in parallel with a capacitor, 122, such as a filter capacitor. The half-bridge circuit includes transistors 103 and 113 coupled between a bridge supply power source, 130, and local circuit ground, 131. Resistors 141, 142, 151, and 152, are included in series with transistors 103 and 113 and represent parasitic line resistance and inductance. These parasitic elements play a dominant role for overshoot and are generally dominant contributors to EMI. Transistors 103 and 113 are illustrated in FIG. 1 as n-channel FETs, but other semiconductor switches such as IGBTs or p-channel devices may also be employed. The half-bridge circuit is driven by a high-side input signal 105 coupled to high-side driver 101 that drives the gate of transistor 103 through resistor 102. Resistor 102 is included to limit the slope (with respect to time) of the gate voltage of transistor 103 to provide a fixed mechanism to limit generation of high frequency EMI. Similarly, the half bridge is driven by a low-side input signal 115 coupled to low-side driver 111 that drives the gate of transistor 113 through resistor 112. The input signals 105 and 115 to the half bridge circuit illustrated in FIG. 1 may be controlled to regulate a low-frequency voltage applied to motor 120 to control its speed of rotation.

Figure 2:
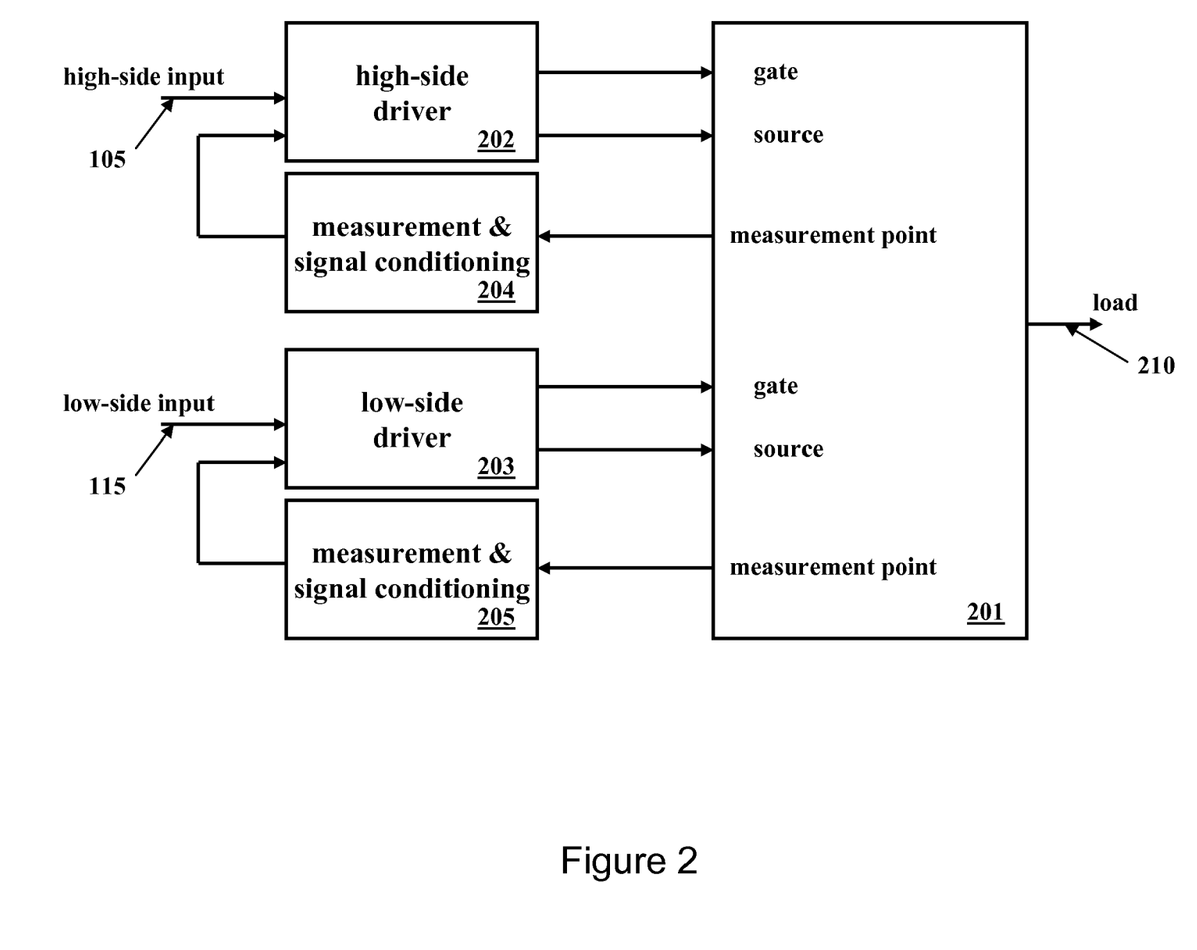
FIGS. 2 and 3 illustrate, respectively, a block diagram and a circuit drawing of high-and low-side drivers coupled to a half-bridge circuit, constructed according to an embodiment.

Turning now to FIG. 2, illustrated is a block diagram of high- and low-side drivers 202 and 203, respectively, coupled to a half-bridge circuit 201, constructed according to an embodiment. The half-bridge circuit 201 is coupled to a load 210 (not shown), such as the motor 120 illustrated in FIG. 1. The high- and low-side drivers are coupled to gate and source terminals of field-effect transistors in the bridge circuit 201, such as the field-effect transistors 103 and 113 illustrated in FIG. 1. The speed of the switching action of the high- and low-side drivers is controlled by the measurement and signal conditioning blocks 204 and 205 that are coupled to measurement points to sense a switching characteristic in the bridge circuit. As the load presented to the bridge circuit 201 dynamically changes, a characteristic of switching transitions of the transistors 103 and 113, such as a switching speed, changes correspondingly. Changed switching characteristics are sensed at the measurement points. Signals sensed at the measurement points by the measurement and signal conditioning blocks are employed to adjust the switching speed of the high- and low-side drivers to reduce conducted and radiated EMI emissions from the circuit.

The sensed characteristic can be, without limitation, a bridge voltage, current, a time derivative of a voltage or current, or a more complex bridge circuit characteristic such as a voltage or current signal envelope, an integral or an average of a voltage or a current, etc. In the case of signal averaging, the output of the circuit performing the sensing process is operable over several switching cycles of a pulse train.

Figure 3:
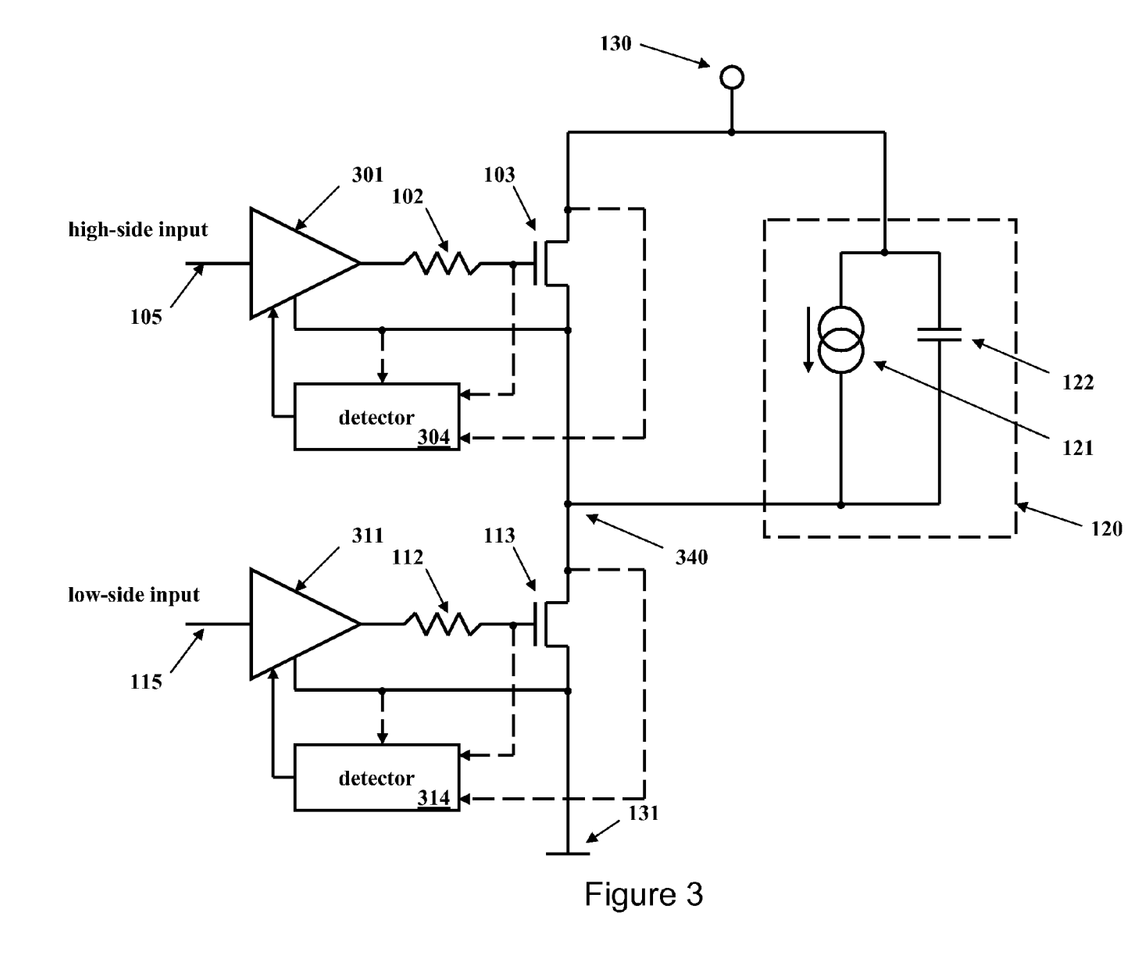

Turning now to FIG. 3, illustrated is a schematic drawing of high- and low-side drivers 301 and 311, respectively, coupled to a half-bridge circuit including transistors 103 and 113, constructed according to an embodiment. The sensing function for the characteristic to control EMI is illustrated by the dashed lines in the figure. The sensed characteristic is coupled to the detectors, 304 and 314. As stated above, the sensed characteristic can be a bridge voltage, current, a time derivative of a voltage or current, etc. The results of the sensing processes performed by detectors 304 and 314 are control signals for the drivers 301 and 311 to change the waveform of the output pulses from these drivers, such as a change in pulse rise time or pulse fall-time.

Figure 4:
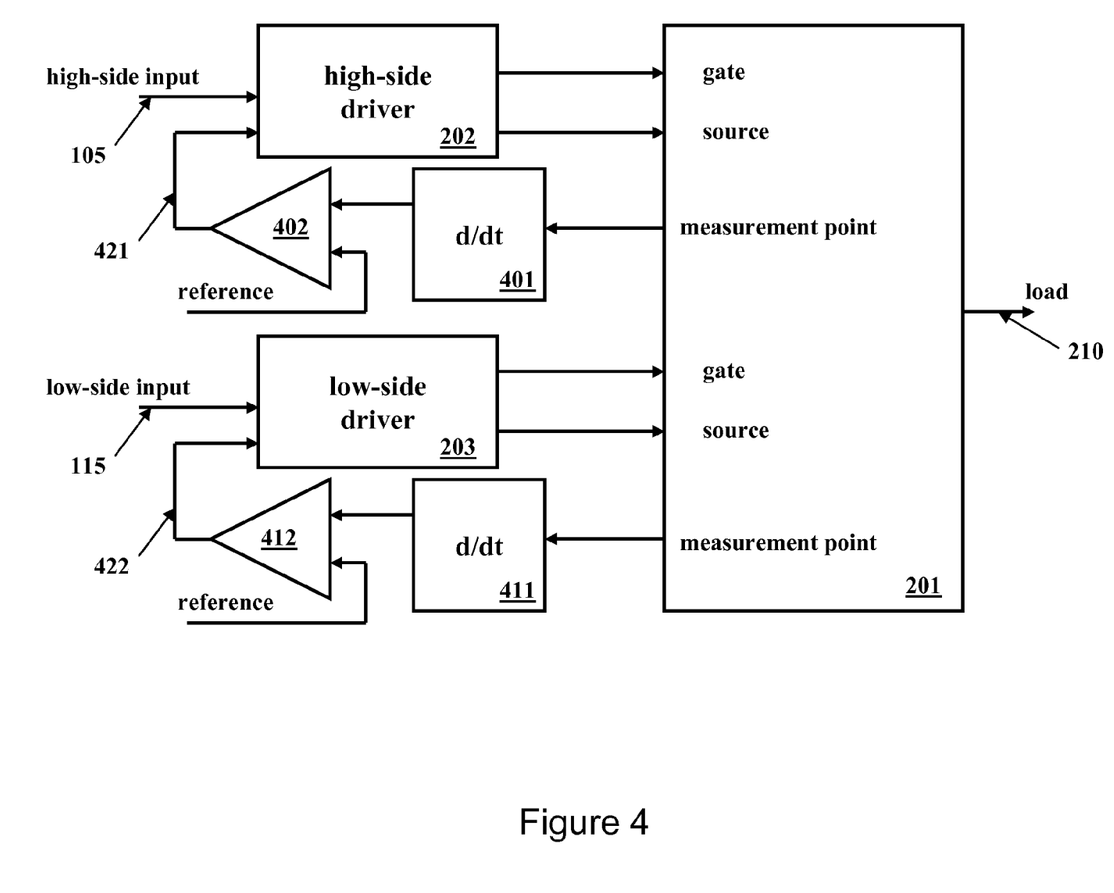
FIG. 4 illustrates a block diagram of a digital implementation of an adjustable two-level driver coupled to an external bridge, wherein detectors are included to measure a voltage difference of the bridge and calculate a derivative thereof.

Turning now to FIG. 4, illustrated is a circuit drawing of a digital implementation of an adjustable two-level driver coupled to external bridge 201, wherein detectors 401, 402, and 411, 412 measure a voltage difference and calculate a derivative thereof. The drawing illustrates two comparators, 402 and 412, which are duplicated to sense separately a characteristic of the upper and the lower bridge transistor to provide the capability to adjust individually the rising and falling edges of signals for these transistors.

The EMI characteristics of a bridge are dependent on derivatives of bridge voltages. Accordingly, a sensed signal value is used to determine whether the derivative of a bridge voltage is greater or smaller than a maximum allowable value, i.e., a reference value. The output of each detector, 421 and 422, respectively, is a binary signal indicating whether a maximum derivative of a bridge voltage has been exceeded.

Figure 5:
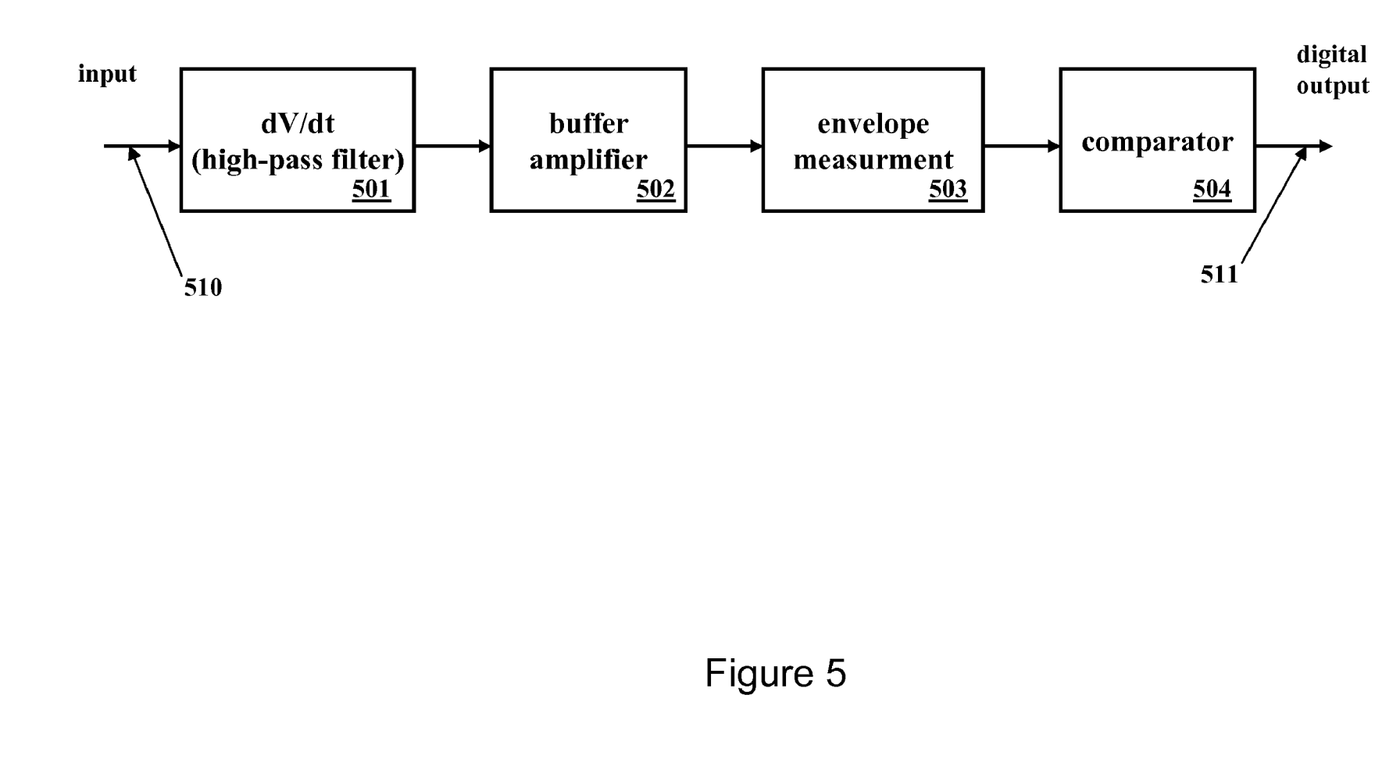
FIG. 5 illustrates a block diagram showing an embodiment to produce digital signals illustrated in FIG. 4.

Turning now to FIG. 5, illustrated is a block diagram showing an embodiment to produce the digital signals 421 and 422 illustrated in FIG. 4. The input signal 510 represents a bridge voltage, such as a drain-to-source voltage of a bridge transistor. The input signal 510 is coupled to high-pass filter 501 that produces the time derivative of the input signal 510. The signal produced by the high-pass filter 501 is sensed and isolated with buffer amplifier 502, and transmitted to envelope measurement block 503 that senses the envelope of signals measured over several switching cycles of the bridge. Comparator 504 compares the amplitude of the signal produced by the envelope measurement block 503 with a reference value to produce a digital output signal 511, indicating whether the envelope or other characteristic has exceeded the reference value. In this example, the envelope of a signal is sensed to provide a measurement for comparison with a reference signal in a comparator. It is not necessary, of course, to sense only the envelope of a signal.

Figure 6:
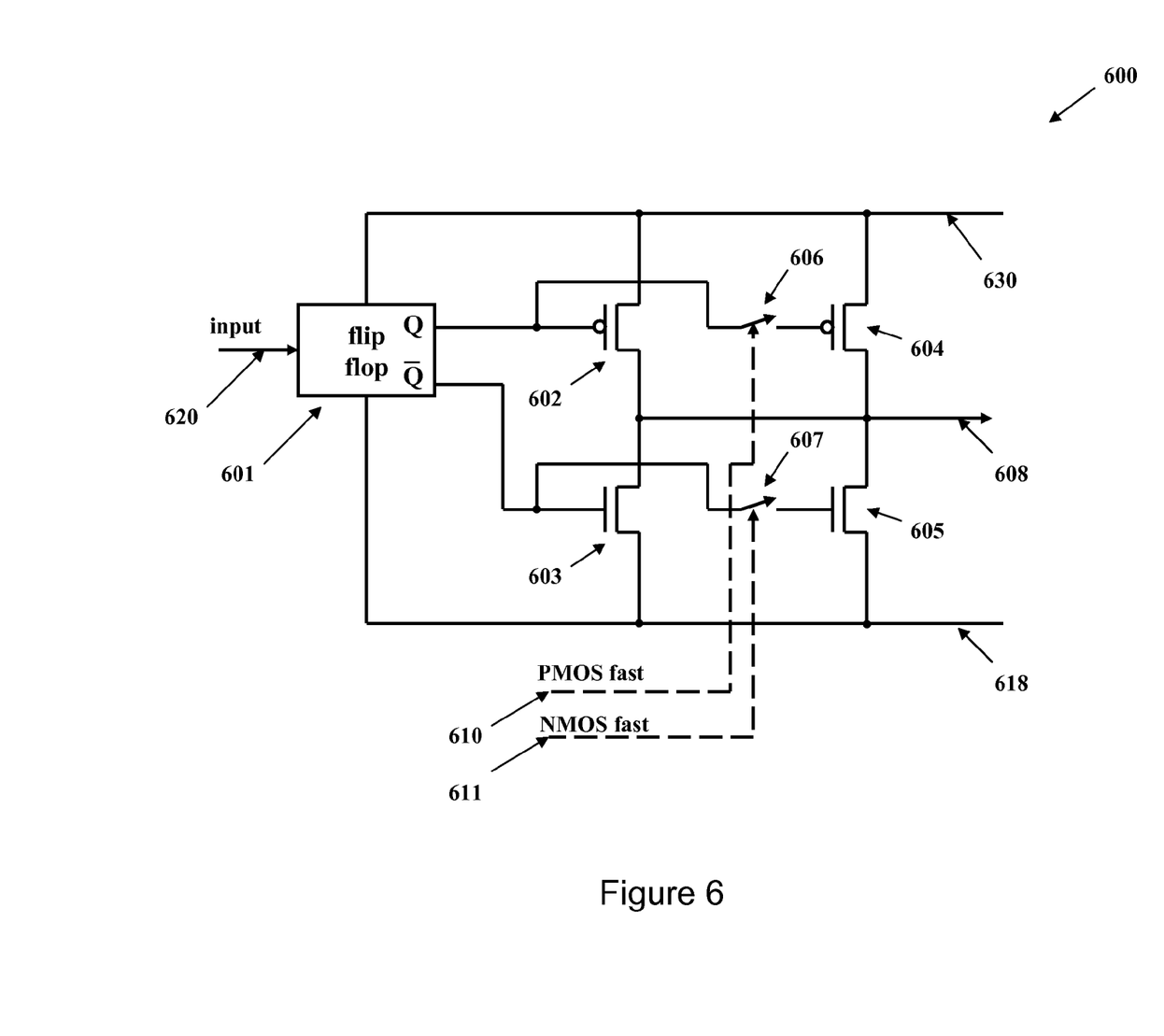
FIG. 6 illustrates a schematic drawing of an embodiment of a bridge driver adapted to operate in a tri-state mode to change its output drive current or its output resistance, constructed according to an embodiment.

FIG. 6 illustrates a schematic drawing of an embodiment of a bridge driver 600 adapted to operate in a tri-state mode to change its output current or its output resistance, such as the bridge drivers 202 and 203 illustrated and described with reference to FIGS. 2 and 4. The bridge driver 600 is coupled to a bias supply 630 and to a local circuit ground, 618, that may be coupled to the source terminal of a bridge transistor. To change the output current or output resistance, the driver is formed with four transistors, two pull-up transistors and two pull-down transistors. The total area of the output transistors corresponds to that of a conventional driver with the same output driving capability. For example, the smaller transistors, 602 and 603, can be transistors with an area that is $\frac{1}{10}$ to $\frac{1}{5}$ the total (pull-up or pull-down) transistor area, the particular value depending on the application and the load current. The larger transistors, 604 and 605, are coupled in a path that is controlled by flip-flop 601. Flip-flop 601 responds to input signal 620 to produce a pulse waveform at the gate drive output signal 608. As illustrated in FIG. 6, switches 606 and 607 are closed by PMOS and NMOS input signals, 610 and 611, respectively, to produce a fast rise time of the output gate drive signal 608 in response to loading or unloading of the bridge. The signals 610 and 611 can be derived from the output signal 511 illustrated in FIG. 5.

Although MOS transistors are illustrated herein in exemplary embodiments, another switch technology, such as a bipolar switch technology, may also be used with appropriate adaptation of circuit elements, as is well known in the art.

Figure 7:
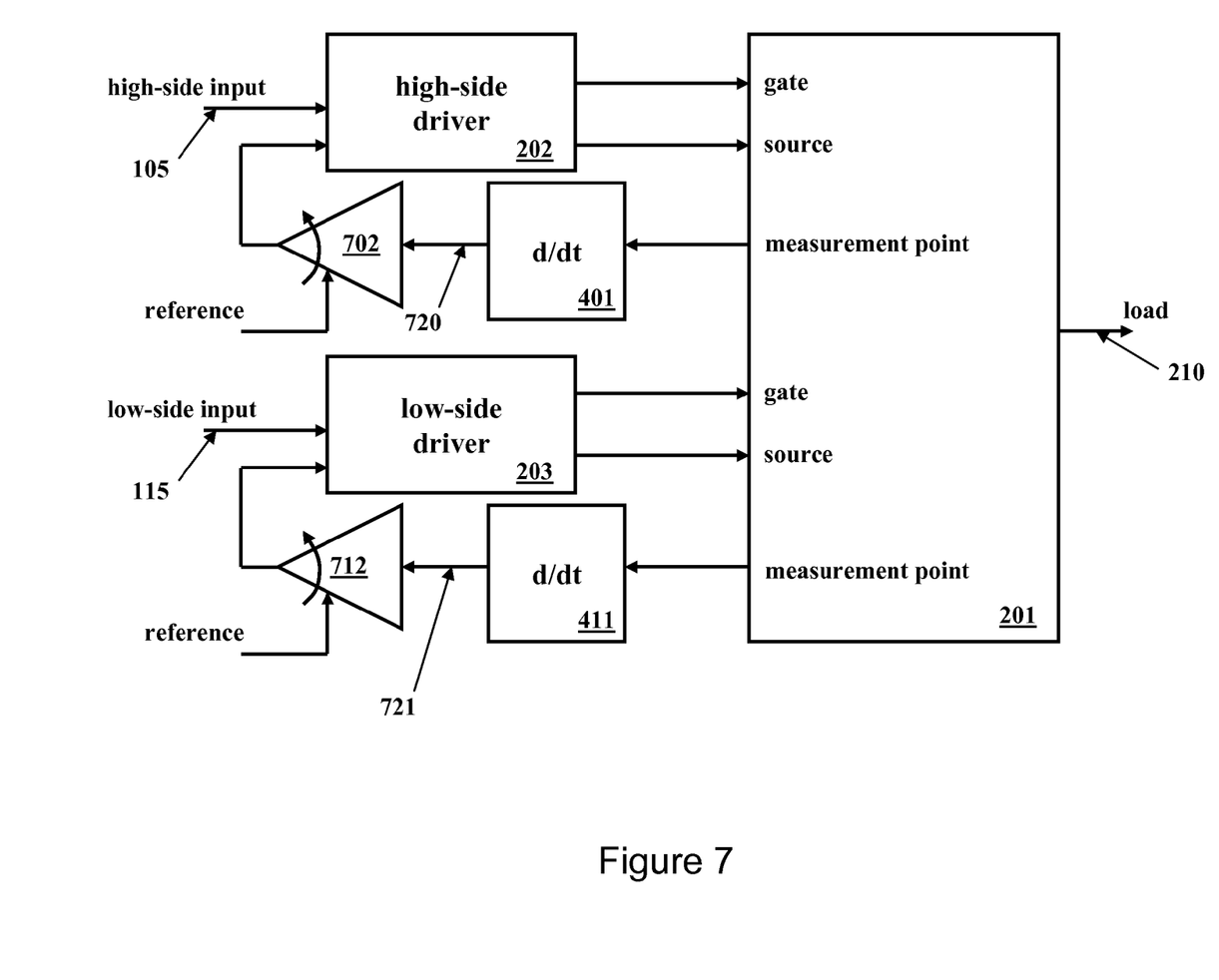
FIG. 7 illustrates a block diagram showing an embodiment of a bridge driven by an adjustable bridge driver, constructed according to an embodiment.

Turning now to FIG. 7, illustrated is a block diagram showing an embodiment of a bridge driven by an adjustable bridge driver. In this embodiment, signals, 720 and 721, represent a time derivative of a voltage that is amplified by adjustable amplifiers, 702 and 712, and coupled as current signal to drivers, 202 and 203. The adjustable amplifiers 702 and 712 are coupled to reference voltage or current levels, as illustrated in FIG. 7. The time derivative of a voltage (or a current) is preferably formed with a high-pass filter, the output signal of which is converted into a current signal to control the rising and falling pulse edges of the signals that control the transistors in the bridge 201.

Envelope detection is not necessary but may be employed.

From circuit simulation, a reference voltage (or current) coupled to the adjustable amplifiers 702 and 712 that controls the steepness of the signal slope for the adjustable amplifiers can be changed depending on the EMI characteristics of the circuit. Analysis and simulation indicate that an improvement of bridge EMI characteristics of the order of 10 dB spanning several decades of frequencies can be readily obtained employing adaptive signal detection.

Figure 8:
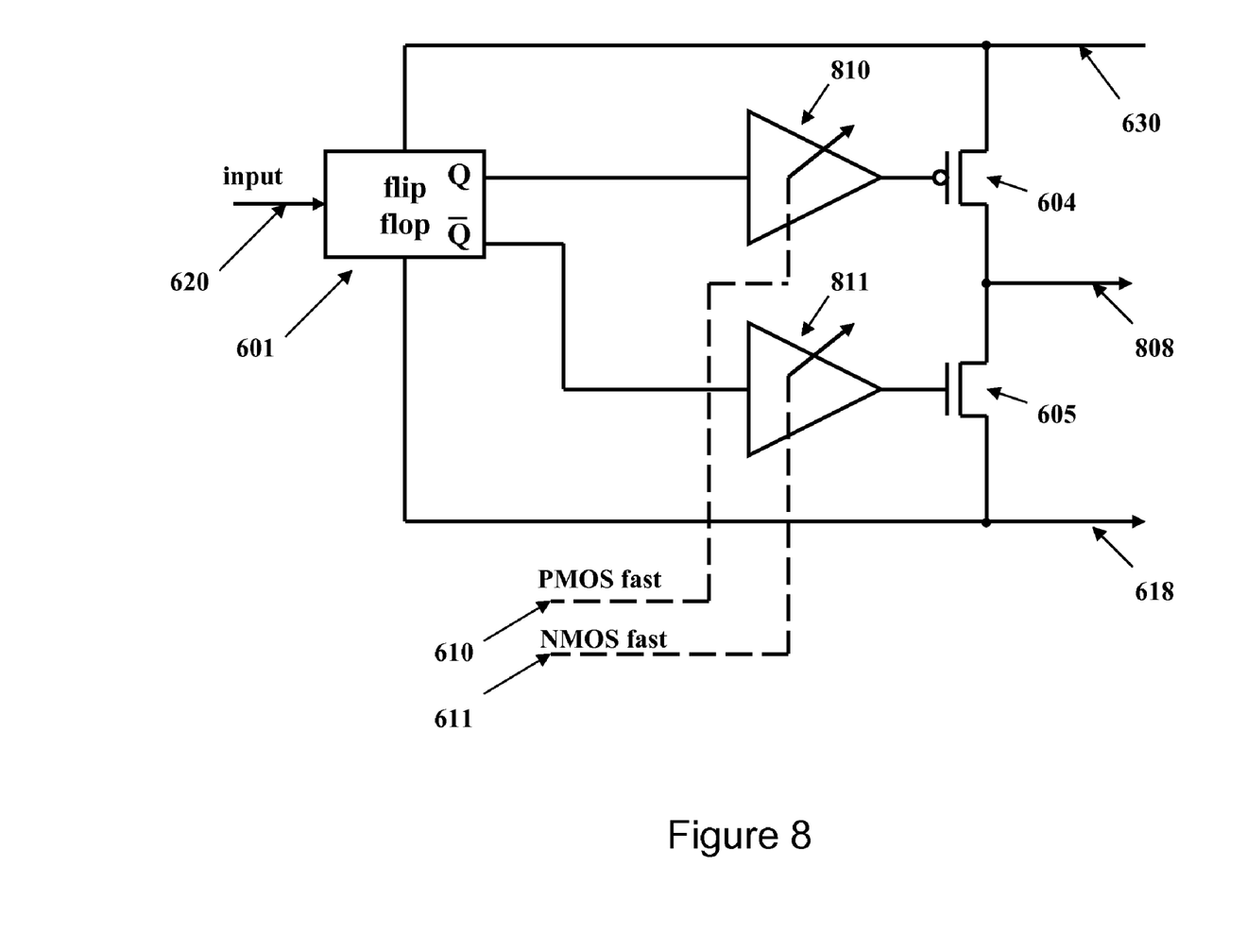
FIG. 8 illustrates a circuit diagram wherein control signals are coupled to adjustable amplifiers to control a drive signal for bridge-drive transistors, thereby providing a structure to improve the spectral EMI characteristics of the bridge, constructed according to an embodiment.

The output currents of the drivers may also be directly controlled by output signals from adjustable amplifiers, as illustrated further in FIG. 8, showing a circuit diagram wherein control signals 610 and 611 are coupled to adjustable amplifiers 810 and 811, thereby controlling a drive signal for drive transistors 604 and 605, thereby providing a further structure to improve the spectral EMI characteristics of the bridge. Normally, the driver output stage is directly switched by a flip-flop. In this circuit illustrated in FIG. 8, the output level of the flip-flop is varied, so the gate current for the internal driver output stage can be varied, which enables variation of the driver output current. In an advantageous embodiment, a bridge transistor is not only switched on softly when a maximum sensed bridge signal is reached, but the bridge drive signal should transition smoothly through the Miller gate-voltage plateau, and the bridge drive signal should exhibit an initial soft-start waveform.

Figure 9:
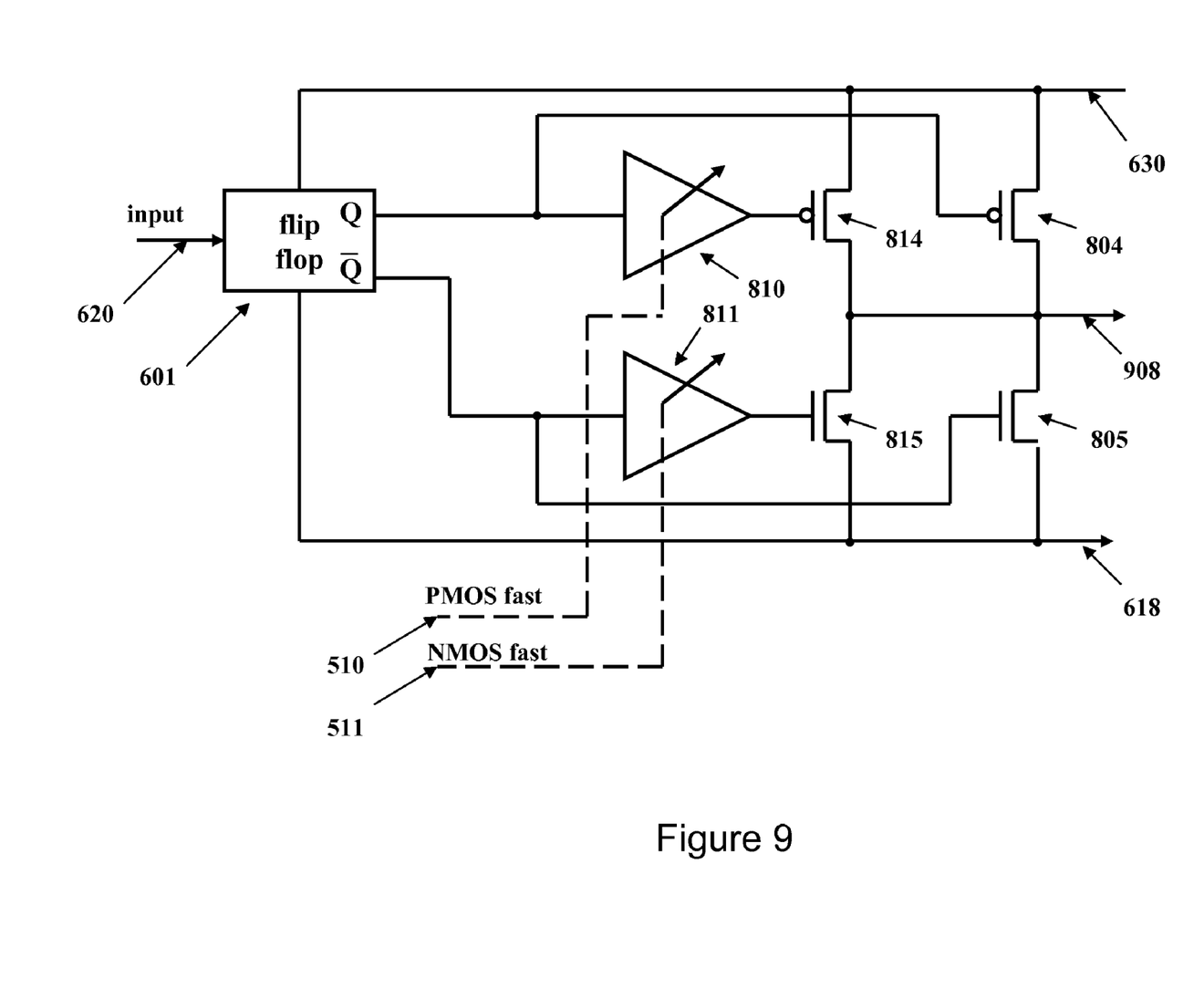
FIG. 9 illustrates a block diagram showing an embodiment of a bridge driver including an adjustable amplifier that avoids the need to switch driver transistors, constructed according to an embodiment.

Turning now to FIG. 9, illustrated is a block diagram showing a further embodiment of a bridge driver including an adjustable amplifier that avoids the need to switch driver transistors. The embodiment illustrated in FIG. 6 produces a step response to a sensed bridge characteristic, which may not be desirable in certain applications. The embodiment illustrated in FIG. 9 employs an adjustable amplifier to control the drive to larger transistors, 814 and 815, but leaves the drive to smaller transistors 804 and 805 unchanged.

Figure 10:
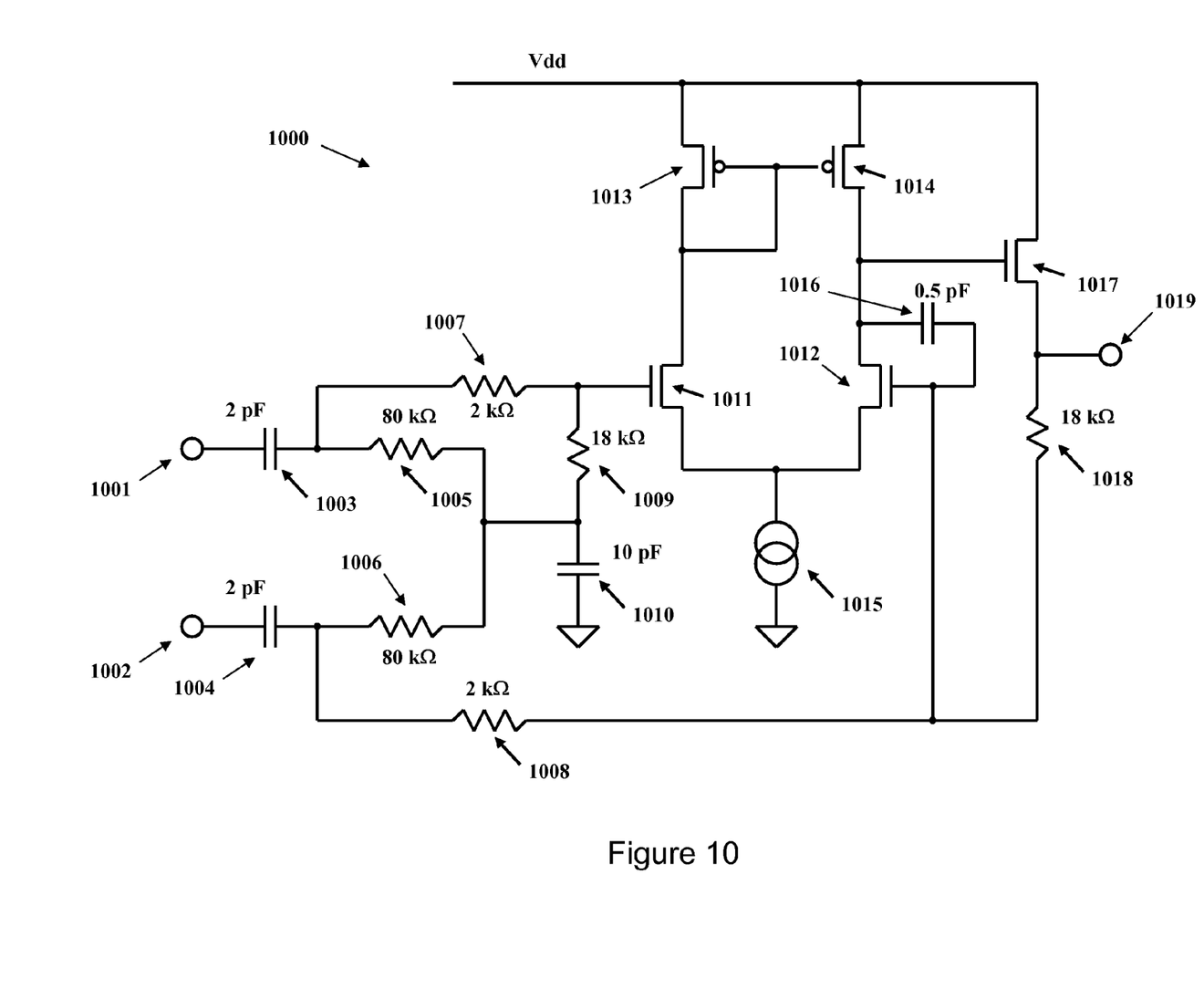
FIG. 10 illustrates a schematic drawing showing an exemplary detector to sense a derivative of an input signal applied between input terminals thereof, constructed according to an embodiment.

Turning now to FIG. 10, illustrated is a schematic drawing showing an exemplary detector to sense a derivative of an input signal applied between noninverting input terminal 1001 and inverting input terminal 1002, constructed according to an embodiment. The detector consists of a resistor-capacitor, balanced, high-pass input filter followed by a buffer amplifier. The resistor-capacitor high-pass input filter includes series resistors 1003 and 1004 and resistors 1005, 1006, 1007, and 1008. The midpoint of the input filter is bypassed to ground by capacitor 1010. The input filter has a zero at the origin of the frequency plane and a pole at 1 MHz set by the time constant of the 2 pF input capacitors, the 80 kΩ resistors and the input impedance of the buffer amplifier to local ac ground.

The input filter is coupled to a buffer amplifier formed with a differential pair including transistors 1011 and 1012 coupled to a current mirror formed with transistors 1013 and 1014. The common node between the differential pair transistors 1011 and 1012 is coupled to current source 1015 to provide a high impedance current for the sources of the differential pair transistors, and to provide a bias current for the current mirror, which is ineffective if not adequately biased with a dc component. A current source can be formed with a cascode arrangement of transistors, as is well known in the art. The gate of transistor 1011 is coupled to the midpoint of the input filter through resistor 1009. Capacitor 1016 and resistor 1018 provide a stabilizing feedback path from the output of the differential pair to an inverting input node, and produce another pole for the detector at about 20 MHz.

The buffer amplifier has a mid-frequency voltage gain of about 9, set by the ratio of resistances of resistor 1005 to resistor 1007 and resistor 1006 to resistor 1008, and provides a high load impedance for the input filter. The output of the buffer amplifier is coupled to an emitter follower formed by transistor 1017 and resistor 1018 coupled to the source of transistor 1017. The output of the detector presents a low impedance produced by the emitter follower. Exemplary values for circuit components are illustrated in FIG. 10.

Figure 11:
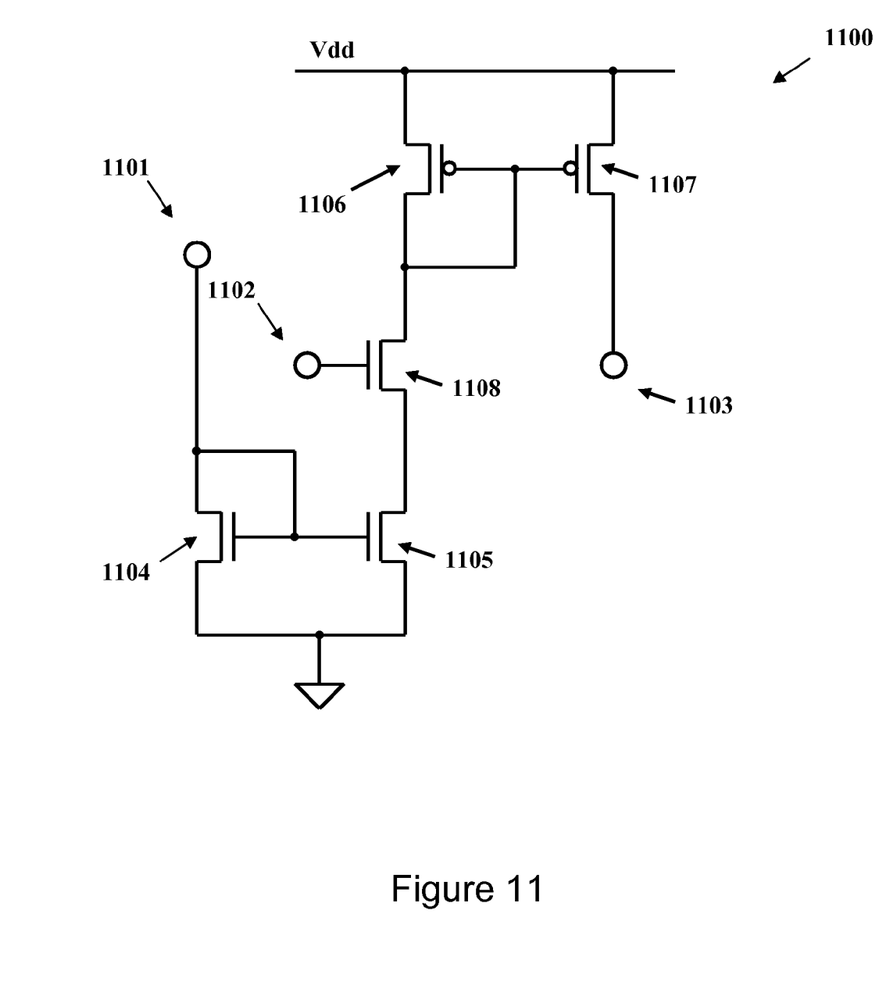
FIG. 11 illustrates a schematic drawing showing an embodiment of a variable-gain current amplifier controlled by a voltage signal applied to an input node.

Turning now to FIG. 11, illustrated is a schematic drawing showing an embodiment of a variable-gain current amplifier 1100 controlled by a voltage signal applied to input node 1102. An input current signal, such as a pulse-width modulated waveform, is coupled to input node 1101 and is reflected by the current mirror formed by npn transistors 1104 and 1105. The reflected current is modulated by cascode transistor 1108 controlled by the voltage applied at the input node 1102 illustrated in FIG. 10. The resulting modulated current is reflected by the current mirror formed by pnp 1106 and 1107, and can be coupled to a following circuit through node 1103. The variable-gain current amplifier 1100 produces a pulse-width modulated current waveform, the amplitude of which is adaptively controlled by a voltage applied at the input node 1102. The voltage applied at the input node 1102 may be produced by the output signal 1019 from detector 1000 that senses a derivative of an input signal, such as a drain or a gate signal of a bridge for which EMI emissions are to be adaptively controlled.

Figure 12:
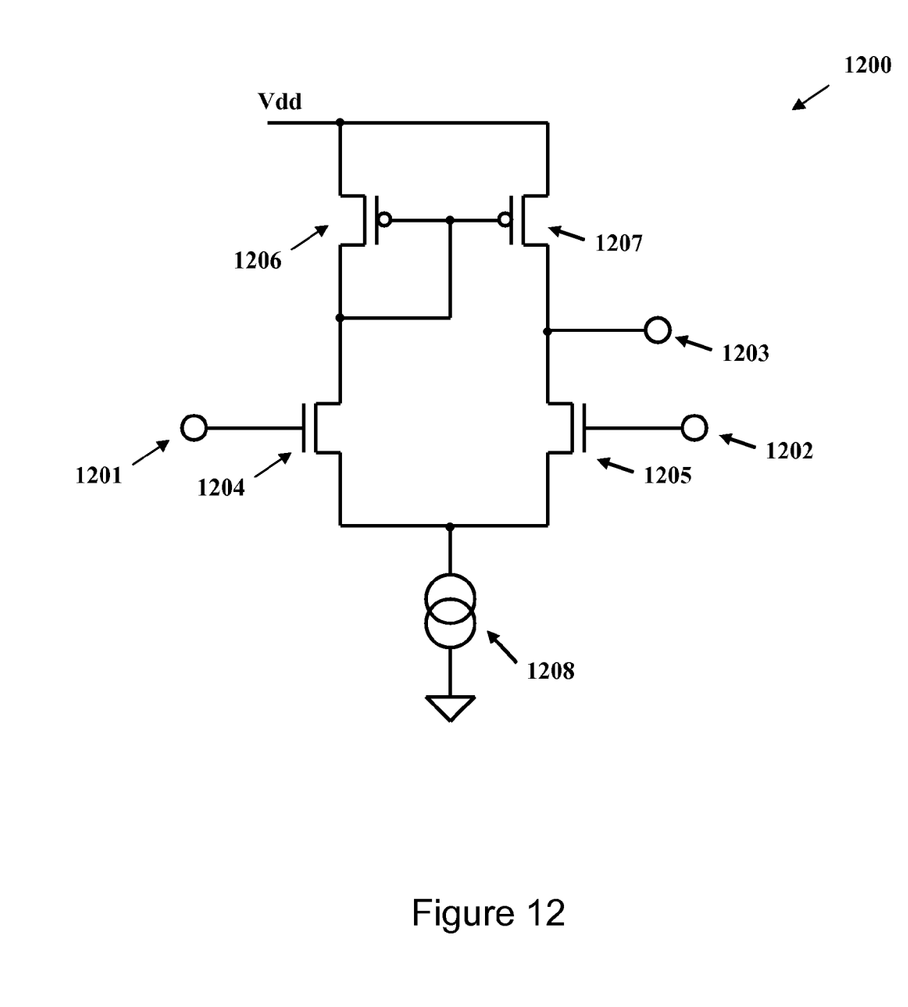
FIG. 12 illustrates a schematic drawing of an exemplary transconductance amplifier that can be used to convert a differential input voltage signal applied between input terminals thereof to a current signal, constructed according to an embodiment.

Turning now to FIG. 12, illustrated is a schematic drawing of an exemplary transconductance amplifier 1200 that can be used in an arrangement to convert a differential PWM ("pulse-width modulated") input voltage signal applied between noninverting input terminal 1201 and inverting input terminal 1202 to a PWM output current signal at output node 1203. The differential voltage input signal produces a differential current between matched npn transistors 1204 and 1205. The transistors 1204 and 1205 are supplied with a current by the current source 1208. The current mirror formed with matched pnp transistors 1206 and 1207 produce the output current signal at output node 1203 that is the difference between the currents flowing through transistors 1204 and 1205.

The transconductance amplifier 1200 illustrated in FIG. 12 can thus be employed to produce a pulse-width modulated current drive signal from a pulse-width modulated voltage drive signal, such as produced by flip-flop 601 illustrated in FIGS. 6, 7, and 9, for the variable-gain current amplifier illustrated in FIG. 11.

Figure 13:
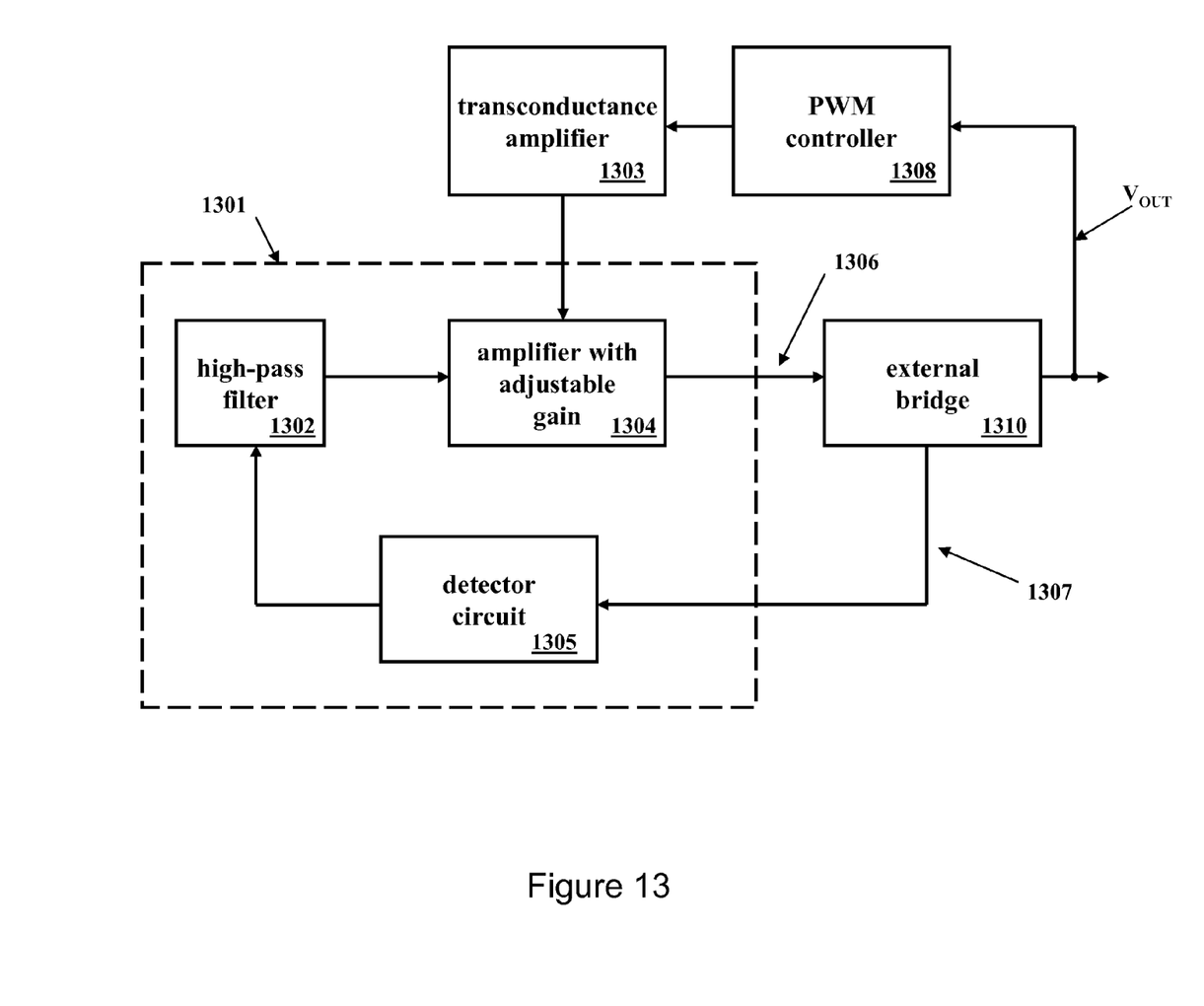
FIG. 13 illustrates a block diagram showing a driver configured to produce a drive signal for an external bridge that regulates a bridge output voltage with adaptively controlled EMI, constructed according to an embodiment.

Turning now to FIG. 13, illustrated is a block diagram showing a driver 1301 configured to adaptively produce a PWM drive signal 1306 (such as the PWM drive signal 1103 illustrated in FIG. 11) for an external bridge 1310. The adaptively produced drive signal 1306 is produced in response to a signal 1307 coupled to detector 1305 to represent a measurement of a switching characteristic of a switch in the external bridge 1310. The detector 1305 is coupled to high-pass filter 1302 to produce a derivative of the measurement of the switching characteristic. The output of the high-pass filter 1302 is coupled to adjustable amplifier 1304 such as the amplifier 1100 with adjustable gain illustrated in FIG. 11 to control the gain thereof. The amplifier 1304 with adjustable gain produces the adaptively formed PWM drive signal 1306 for the external bridge 1310.

An output characteristic of the external bridge 1310 such as its output voltage $V_{OUT}$ is sensed by PWM controller 1308. The output of PWM controller 1308 is coupled to transconductance amplifier 1303 to produce a PWM current signal for the amplifier 1304 with adjustable gain, the output of which is coupled to the external bridge to regulate the output characteristic thereof. In this manner, the PWM drive signal 1306 for the external bridge is adaptively produced to control its EMI as well as its output voltage.

In the embodiments described previously hereinabove, the drain-source (or collector-emitter) voltage of an external bridge transistor is sensed. An alternative to sensing a drain-source voltage of a bridge transistor is sensing a gate-source voltage. In a further alternative embodiment, a drain current, gate, collector, or emitter current can be sensed. Current measurements generally require a higher design and implementation effort than voltage measurements, and accordingly implementations described herein, without limitation, rely on voltage measurements. An advantage of sensing a gate-source voltage of a bridge transistor is that this voltage tends to have a fast response time, and therefore other portions of the detection circuit may not be required to be as fast in their response time. Based on simulation of a circuit that includes measurement of a bridge gate-to-source voltage, it has been demonstrated that a bridge output voltage EMI characteristic can be substantially influenced by employing a gate-to-source voltage measurement. The derivative of the drain-source voltage of the switch (or the drain-gate or gate-source voltage) can also be employed to represent a bridge switching characteristic to pre-distort the gate-to-source voltage. The actual output voltage of the bridge can also be used to control the output signal level of a driver.

The concept has thus been introduced of sensing a switching characteristic of an external bridge to control a waveform of a drive signal for a switch therein to adaptively control EMI. In an embodiment, a driver is configured to produce the drive signal. The driver includes a detector configured to measure the switching characteristic of a switch in the external bridge, and an adjustable circuit element coupled to the detector. A signal produced by the detector in response to the measured switching characteristic is employed to adjust a waveform characteristic of the drive signal. In an embodiment, the measured switching characteristic is a derivative of a voltage of the switch in the external bridge. In a further embodiment, the derivative of the voltage is a derivative of a drain-to-source voltage of the switch in the external bridge. In an embodiment, the switch is a power switch of a half-bridge circuit. In a further embodiment, the driver includes a first and a second plurality of drive transistors. The drive transistors of the second plurality are respectively coupled in parallel with the drive transistors of the first plurality, and the drive transistors of the second plurality are disabled by assertion of the signal produced by the detector. In an embodiment, the drive transistors of the second plurality are substantially larger then the drive transistors of the first plurality. In an embodiment, the adjustable circuit element includes an amplifier with an adjustable gain, and the adjustable gain is controlled by the signal produced by the detector. In an embodiment, the amplifier with the adjustable gain comprises a transistor coupled in series with a leg of a current mirror, and the signal produced by the detector is coupled to the transistor coupled in series with the leg of the current mirror to control the waveform characteristic of the drive signal. In an embodiment, the driver further includes a transconductance amplifier with an output coupled to an input of the amplifier with the adjustable gain. In an embodiment, the driver further includes a high-pass filter with an output coupled to an input of the amplifier with the adjustable gain.

Another exemplary embodiment provides a method of producing a drive signal. In an embodiment, the method includes measuring a switching characteristic of an external bridge circuit such as a switching characteristic of a switch in the external bridge circuit, and adjusting a waveform characteristic of a drive signal for the switch in response to the measured switching characteristic. In an embodiment, the switching characteristic is a derivative of a voltage of the switch. In a further embodiment, the derivative of the voltage is a derivative of a drain-to-source voltage of the switch. In an embodiment, the switch is a power switch of a half-bridge circuit. In an embodiment, the method further includes coupling a first plurality of drive transistors to the switch, coupling a second plurality of drive transistors respectively in parallel with the first plurality of drive transistors, and disabling the drive transistors of the second plurality in response to the measured switching characteristic crossing a threshold level. In an embodiment, the drive transistors of the second plurality are substantially larger than the drive transistors of the first plurality. In an embodiment, the method further includes adjusting the waveform characteristic of the drive signal for the external switch with an amplifier with an adjustable gain, and controlling the adjustable gain with the measured switching characteristic. In an embodiment, the method further includes coupling a transistor in series with a leg of a current mirror to form the amplifier with the adjustable gain, and controlling the transistor with the measured switching characteristic of the switch. In an embodiment, the method further includes forming an input signal for the amplifier with the adjustable gain with a transconductance amplifier. In an embodiment, the method further includes forming a control signal for the amplifier with the adjustable gain with a high-pass filter.

Although processes to control a waveform of a drive signal for a switch to adaptively control EMI and related methods have been described for application to a half-bridge circuit, it should be understood that other applications of these processes such as for a power amplifier or a motor controller are contemplated within the broad scope of the invention, and need not be limited to half-bridge applications employing processes introduced herein.

Although the invention has been shown and described primarily in connection with specific exemplary embodiments, it should be understood by those skilled in the art that diverse changes in the configuration and the details thereof can be made without departing from the essence and scope of the invention as defined by the claims below. The scope of the invention is therefore determined by the appended claims, and the intention is for all alterations that lie within the range of the meaning and the range of equivalence of the claims to be encompassed by the claims.

What is claimed is:

1. A driver configured to produce a drive signal, comprising:
    a detector configured to measure a switching characteristic of an external switch; and
    an adjustable circuit element coupled to the detector, wherein a signal produced by the detector in response to the measured switching characteristic is employed to adjust a waveform characteristic of the drive signal, the waveform characteristic comprising a slope of the drive signal;
    a first plurality of drive transistors; and a second plurality of drive transistors, wherein the drive transistors of the second plurality are respectively coupled in parallel with the drive transistors of the first plurality, and wherein the drive transistors of the second plurality are disabled by assertion of the signal produced by the detector.

2. The driver as claimed in claim 1 wherein the measured switching characteristic is a derivative of a voltage of the external switch.

3. The driver as claimed in claim 2, wherein the derivative of the voltage is a derivative of a drain-to-source voltage of the external switch.

4. The driver as claimed in claim 1, wherein the external switch is a power switch of a half-bridge circuit.

5. The driver as claimed in claim 1, wherein the drive transistors of the second plurality are substantially larger than the drive transistors of the first plurality.

6. The driver as claimed in claim 1, wherein the adjustable circuit element comprises an amplifier with an adjustable gain, and wherein the adjustable gain is controlled by the signal produced by the detector.

7. A method of producing a drive signal, the method comprising:
    measuring a switching characteristic of an external switch; and
    adjusting a waveform characteristic of the drive signal in response to the measured switching characteristic, the waveform characteristic comprising a slope of the drive signal;
    coupling a first plurality of drive transistors to the external switch; coupling a second plurality of drive transistors respectively in parallel with the first plurality of drive transistors; and disabling the drive transistors of the second plurality in response to the measured switching characteristic crossing a threshold level.

8. The method as claimed in claim 7 wherein the switching characteristic is a derivative of a voltage of the external switch.

9. The method as claimed in claim 8, wherein the derivative of the voltage is a derivative of a drain-to-source voltage of the external switch.

10. The method as claimed in claim 7, wherein the external switch is a power switch of a half-bridge circuit.

11. The method as claimed in claim 7, wherein the drive transistors of the second plurality are substantially larger than the drive transistors of the first plurality.

12. A method of producing a drive signal, the method comprising:
    measuring a switching characteristic of an external switch; and adjusting a waveform characteristic of the drive signal in response to the measured switching characteristic, the waveform characteristic comprising a slope of the drive signal;
    adjusting the waveform characteristic of the drive signal for the external switch with an amplifier with an adjustable gain; and
    controlling the adjustable gain with the measured switching characteristic.

13. The method as claimed in claim 12, further comprising:
    coupling a transistor in series with a leg of a current mirror to form the amplifier with the adjustable gain; and
    controlling the transistor with the measured switching characteristic of the external switch.

14. The method as claimed in claim 12, further comprising forming an input signal for the amplifier with the adjustable gain with a transconductance amplifier.

15. The method as claimed in claim 14, further comprising forming a control signal for the amplifier with the adjustable gain with a high-pass filter.

16. The method as claimed in claim 12, further comprising:
    driving the external switch; and
    driving a motor with the external switch.

17. A driver configured to produce a drive signal, comprising:
    a detector configured to measure a switching characteristic of an external switch; and
    an adjustable circuit element coupled to the detector, wherein a signal produced by the detector in response to the measured switching characteristic is employed to adjust a waveform characteristic of the drive signal, wherein the adjustable circuit element comprises an amplifier with an adjustable gain, and wherein the adjustable gain is controlled by the signal produced by the detector.

18. The driver as claimed in claim 17, wherein the measured switching characteristic is a derivative of a voltage of the external switch.

19. The driver as claimed in claim 17, wherein the amplifier with the adjustable gain comprises a transistor coupled in series with a leg of a current mirror, wherein the signal produced by the detector is coupled to the transistor coupled in series with the leg of the current mirror to control the waveform characteristic of the drive signal.

20. The driver as claimed in claim 17, wherein the driver further comprises a transconductance amplifier with an output coupled to an input of the amplifier with the adjustable gain.

21. The driver as claimed in claim 17, wherein the driver further comprises a high-pass filter with an output coupled to an input of the amplifier with the adjustable gain.

* * * * *